United States Patent
Lin et al.

(10) Patent No.: US 10,700,071 B1
(45) Date of Patent: Jun. 30, 2020

(54) METHOD FOR FORMING SEMICONDUCTOR PATTERN

(71) Applicant: UNITED MICROELECTRONICS CORP., Hsin-Chu (TW)

(72) Inventors: Gang-Yi Lin, Taitung County (TW); Shih-Fang Tzou, Tainan (TW); Fu-Che Lee, Taichung (TW); Feng-Yi Chang, Tainan (TW); Ying-Chih Lin, Tainan (TW); Kai-Lou Huang, New Taipei (TW); Yi-Ching Chang, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 5 days.

(21) Appl. No.: 16/258,657

(22) Filed: Jan. 27, 2019

(30) Foreign Application Priority Data

Jan. 2, 2019 (CN) .......................... 2019 1 0001196

(51) Int. Cl.
*H01L 21/033* (2006.01)
*H01L 21/308* (2006.01)
*H01L 27/108* (2006.01)

(52) U.S. Cl.
CPC .. *H01L 27/10876* (2013.01); *H01L 27/10823* (2013.01); *H01L 27/10897* (2013.01)

(58) Field of Classification Search
CPC ......... H01L 27/10876; H01L 27/10897; H01L 27/10823; H01L 21/0332; H01L 21/0337; H01L 21/0338; H01L 21/3081; H01L 21/3086; H01L 21/3088; H01L 21/31144
See application file for complete search history.

(56) References Cited

U.S. PATENT DOCUMENTS

| | | | |
|---|---|---|---|
| 7,709,396 B2 | 5/2010 | Bencher | |
| 2006/0046484 A1* | 3/2006 | Abatchev | H01L 21/0332 438/689 |
| 2016/0013103 A1* | 1/2016 | Huang | H01L 21/0332 438/666 |
| 2017/0025420 A1* | 1/2017 | Park | H01L 27/10894 |

\* cited by examiner

*Primary Examiner* — Selim U Ahmed
(74) *Attorney, Agent, or Firm* — Winston Hsu

(57) ABSTRACT

The present invention provides a method for forming a semiconductor pattern, comprising: firstly, a target layer is provided and a first material layer is formed on the target layer, and then a first pattern is formed on the first material layer, followed by a first self-aligned double patterning step is performed, a plurality of first grooves are formed in the first material layer. Next, a second material layer is formed on the first material layer, and a plurality of second grooves are formed in the second material layer. Next, transferring a pattern of the overlapping portion of the first grooves and the second grooves into the target layer, the target layer includes a plurality of third patterns and a plurality of fourth patterns, an area of each fourth pattern is larger than an area of each third pattern.

16 Claims, 7 Drawing Sheets

METHOD FOR FORMING SEMICONDUCTOR PATTERN

BACKGROUND OF THE INVENTION

1. Field of the Invention

The present invention relates to the field of semiconductor processing, and more particularly to a method of forming a semiconductor pattern capable of reducing micro-loading effects.

2. Description of the Prior Art

Dynamic random access memory (DRAM) is a kind of volatile memory, which is constituted by a plurality of memory cells. Each memory cell is mainly constituted by one transistor and one capacitor controlled by a transistor, and each memory cell are electrically connected by the word line (WL) and bit line (BL).

In order to improve the operation speed of the dynamic random access memory, and to meet consumer demand for miniaturization of electronic devices, the channel length of the transistor of the dynamic random access memory needs to be shorten. However, others issues may be happened, such as short channel effects, the on current loss and other problems.

Accordingly, in order to overcome the above problems, in recent years, the vertical transistor structure replaces the horizontal transistor structure, for example, the vertical transistor structure is formed in a deep trench in the substrate. In this way, the operating speed and the volume can be improved, and the short channel effect and other issues can also be prevented. However, the general vertical transistor used in structural design still needs to be improved, it is one of the goals researched in this field.

SUMMARY OF THE INVENTION

The present invention provides a method for forming a semiconductor pattern, the method includes: firstly, a target layer is provided, and a first material layer is formed on the target layer, next, a first pattern is formed on the first material layer, and a first self-aligned double pattering step is performed, to define a plurality of first sidewall patterns around the first pattern, and to transfer the first sidewall patterns into the first material layer to form a plurality of first grooves in the first material layer, afterwards, a second material is formed on the first material layer, next, a second self-aligned pattern transfer step is performed, to define a plurality of second sidewall patterns around the second pattern, and to transfer the second sidewall patterns into the second material layer to form a plurality of second grooves in the second material layer, and an etching step is performed, to transfer an overlapping portion of the first grooves and the second grooves into the target layer, the target layer includes a plurality of third patterns and a plurality of fourth patterns from a top view, and an area of each of the fourth patterns is larger than an area of each of the third patterns.

The present invention is characterized in that a first pattern and a second pattern of a special shape are designed, and a storage node contact hole is formed by means of SADP (self-aligned double patterning). Therefore, a plurality of holes arranged in an array are formed in the central region, and the holes having a larger area are formed on the outer periphery. As a result, defects caused by micro-loading effects in the semiconductor process can be reduced. In addition, the present invention can also control the size of the holes formed by adjusting the overlapping position of the first pattern and the second pattern.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
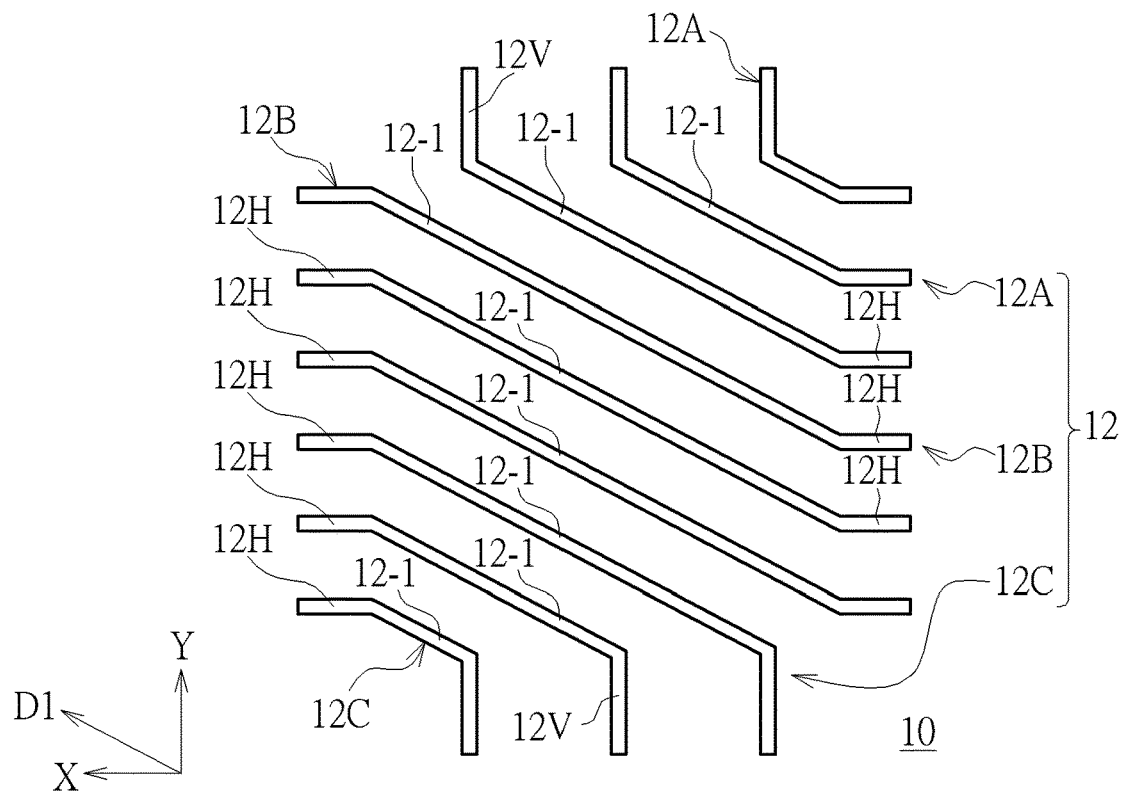
FIG. 1 is a top plan view of a first pattern of the present invention.
Figure 2:
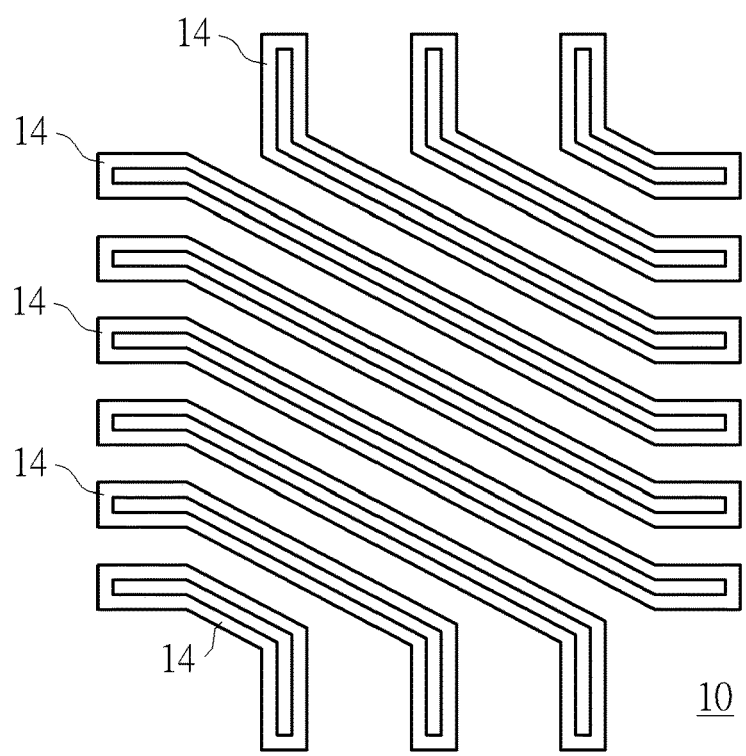
FIG. 2 illustrates a schematic diagram of forming a first groove around the first pattern by means of self-aligned double pattering (SADP).
Figure 3:
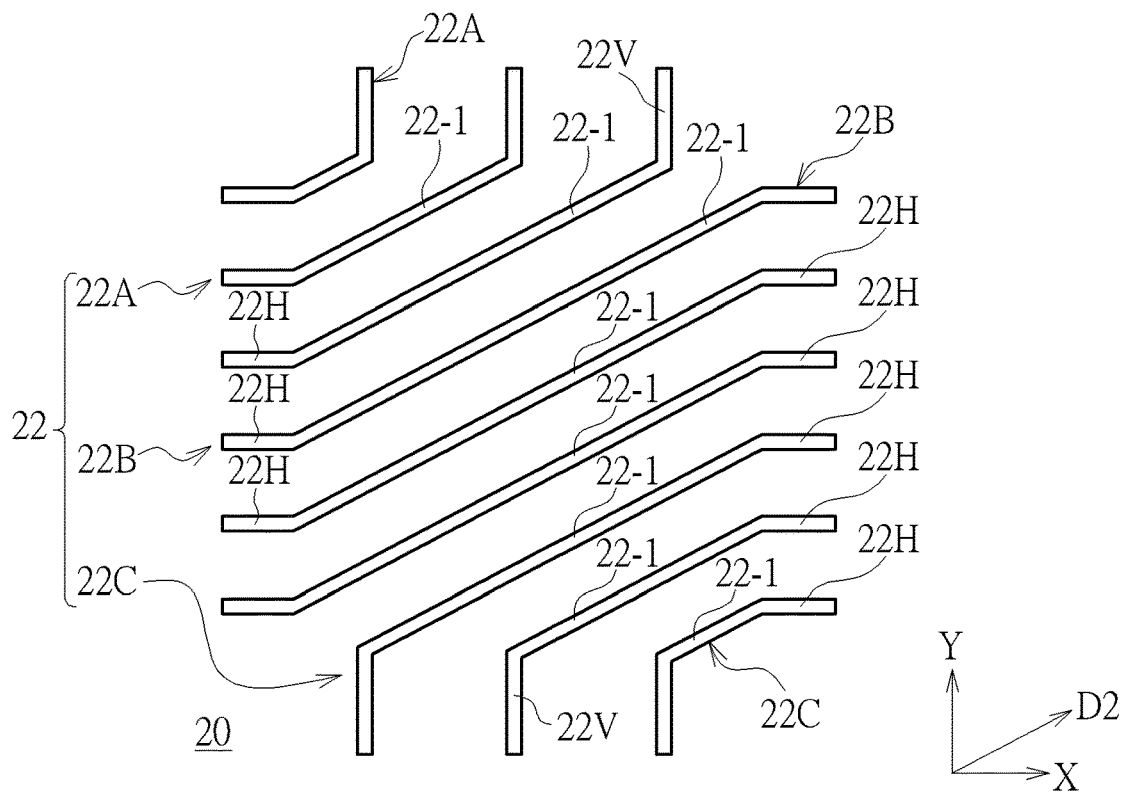
FIG. 3 is a top plan view of a second pattern of the present invention.
Figure 4:
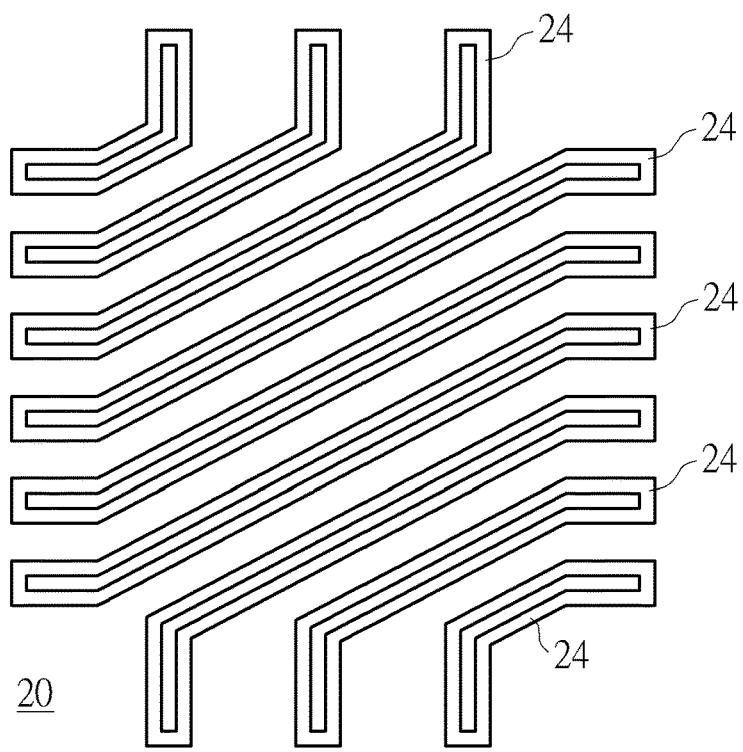
FIG. 4 illustrates a schematic diagram of forming a second grooves around the second pattern by means of self-aligned double patterning.
Figure 5:
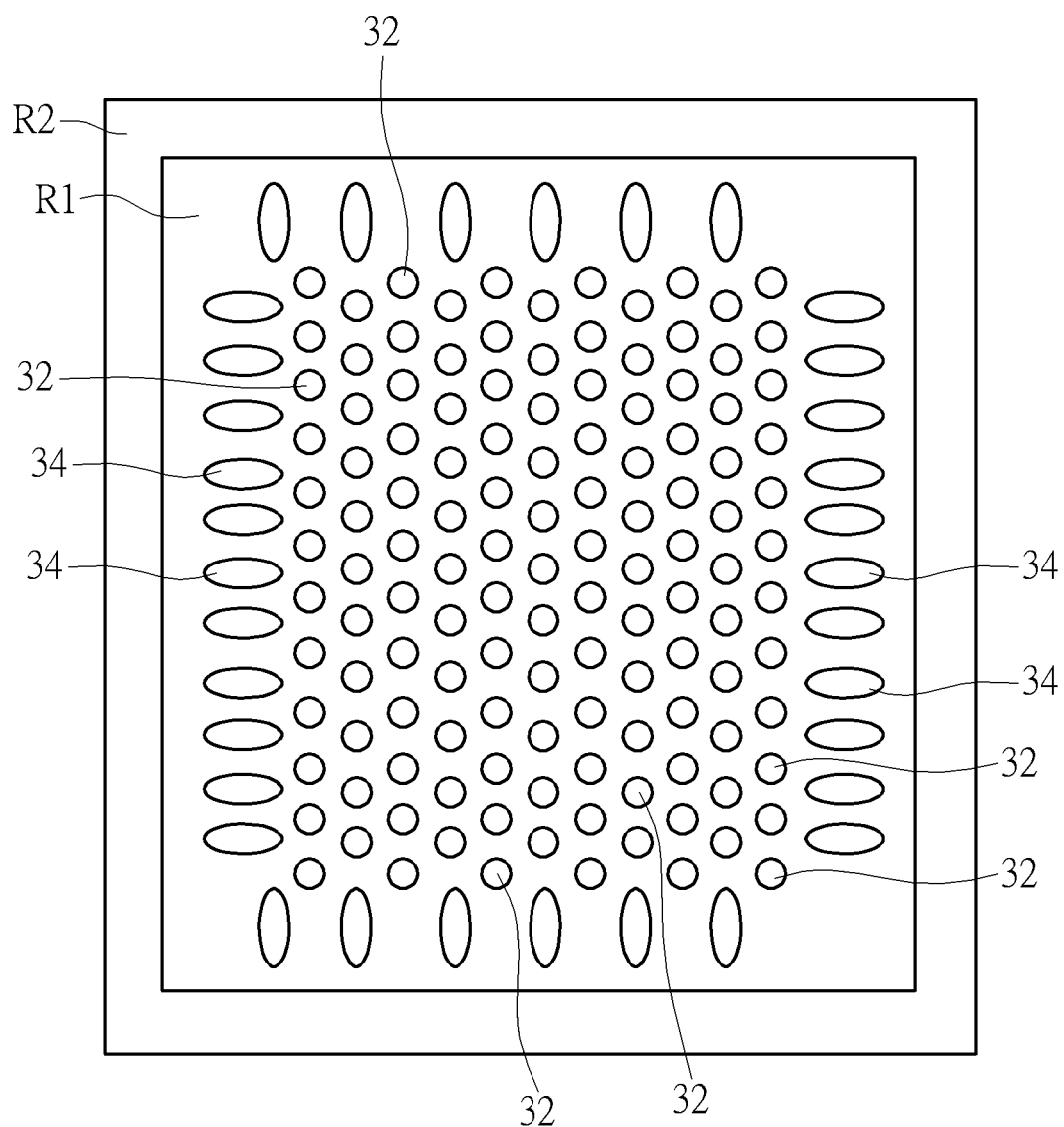
FIG. 5 is a schematic view showing an overlapping portion of the first groove and the second groove.

As shown in FIG. 1 to FIG. 5, FIG. 1 is a top view of a first pattern of the present invention; FIG. 2 illustrates a schematic view of a method of forming a plurality of first grooves surrounding the first pattern by using self-aligned double pattering (SADP); FIG. 3 is a top view of a second pattern of the present invention; FIG. 4 illustrates a schematic view of a method of forming a plurality of second grooves surrounding the second pattern by using self-aligned double pattering (SADP); FIG. 5 is a schematic view showing the overlapping portion of the first grooves and the second grooves.

First, as shown in FIG. 1, a first pattern 12 is formed on a first material layer 10, the material of the first material layer 12 is, for example, silicon nitride, and the material of the first pattern 12 is, for example, silicon oxide, but is not limited thereto this. When viewed from a top view, the first pattern 12 is a pattern composed of a plurality of lines, and the lines do not contact each other. Further, the first pattern 12 includes a plurality of sub-patterns, which are a plurality of first sub-patterns 12A, a plurality of second sub-patterns 12B, and a plurality of third sub-patterns 12C, the second sub-patterns 12B are located between the first sub-patterns 12A and the third sub-patterns 12C. That is, the plurality of first sub-patterns 12A, the plurality of second sub-patterns 12B and the plurality of third sub-patterns 12C constitute the first pattern 12. Each first sub-pattern 12A, each second sub-pattern 12B and each third sub-pattern 12C include an elongated structure 12-1 arranged along a first direction D1. The first direction D1 here is preferably not parallel to a horizontal direction X and a vertical direction Y. In addition, each of the first sub-patterns 12A includes a horizontal component 12H and a vertical component 12V respectively located at two terminals of the elongated structure 12-1; each second sub-pattern 12B includes two horizontal components 12H located at two terminals of the elongated structure 12-1; each third sub-pattern 12C includes a horizontal component 12H and a vertical component 12V located at two terminals of the elongated structure 12-1. The horizontal component 12H is arranged in parallel with the horizontal direction X, and the vertical component 12V is arranged in parallel with the vertical direction Y. In addition, each first sub-pattern 12A, each second sub-pattern 12B, and each third sub-pattern 12C is an integrally formed structure, that is, they comprises the same material as the material of the horizontal component 12H and the material of the vertical component 12V (such as silicon oxide) as the elongated structure 12-1, and furthermore, they can be formed on the same plane at the same time. Therefore, when viewed from the top view, each first sub-pattern 12A, each second sub-pattern 12B, and each third sub-pattern 12C is a structure composed of three straight lines (that is, a linear structure having two corners).

As shown in FIG. 2, FIG. 2 illustrates a schematic view of a method of forming a plurality of first grooves surrounding the first pattern by using self-aligned double pattering (SADP). The SADP method described herein is a technique known in the art and is characterized in that a groove can be formed surrounding the pattern. That is, since the first pattern 12 is formed on the first material layer 10, a plurality of first grooves 14 will be formed in the first material layer 10, and the first grooves 14 will surround the original position of the first sub-patterns 12A, the original position of the second sub-patterns 12B and the original position of the third sub-patterns 12C. Next, the first sub-patterns 12A, the second sub-patterns 12B and the third sub-patterns 12C are subsequently removed. The SADP process steps will be briefly mentioned in the following paragraphs, and the rest details of the SADP process will not be repeated here.

The first pattern 12 described above is formed on the first material layer 10, and a plurality of first grooves 14 are formed in the first material layer 10. Next, in the subsequent process of the present invention, another second material layer 20 is then formed on the first material layer 10, and a second pattern 22 is further formed on the second material layer 20. The second pattern 22 intersects the first pattern 12, in some embodiments, the second pattern 22 is similar to the pattern of the first pattern 12 but they have different arrangement direction, for example, the first pattern 12 and the second pattern 22 are mirror images of each other (that is, the same patterns after rotating 180 degrees along the horizontal direction or the vertical direction), but is not limited to this. The second pattern 22 includes a plurality of sub-patterns, which are a plurality of first sub-patterns 22A, a plurality of second sub-patterns 22B, and a plurality of third sub-patterns 22C, the second sub-patterns 22B are located between the first sub-patterns 22A and the third sub-patterns 22C. That is, the plurality of first sub-patterns 22A, the plurality of second sub-patterns 22B and the plurality of third sub-patterns 22C constitute the second pattern 22. Each first sub-pattern 22A, each second sub-pattern 22B and each third sub-pattern 22C include an elongated structure 22-1 arranged along a second direction D2. The second direction D2 here is preferably not parallel to the horizontal direction X, the vertical direction Y and the first direction D1. In addition, each of the first sub-patterns 22A includes a horizontal component 22H and a vertical component 22V respectively located at two terminals of the elongated structure 22-1; each second sub-pattern 22B includes two horizontal components 22H located at two terminals of the elongated structure 22-1; each third sub-pattern 22C includes a horizontal component 22H and a vertical component 22V located at two terminals of the elongated structure 22-1. The horizontal component 22H is arranged in parallel with the horizontal direction X, and the vertical component 22V is arranged in parallel with the vertical direction Y. In addition, each first sub-pattern 22A, each second sub-pattern 22B, and each third sub-pattern 22C is an integrally formed structure, that is, they comprises the same material as the material of the horizontal component 22H and the material of the vertical component 22V (such as silicon oxide) as the elongated structure 22-1, and furthermore, they can be formed on the same plane at the same time. Therefore, when viewed from the top view, each first sub-pattern 22A, each second sub-pattern 22B, and each third sub-pattern 22C is a structure composed of three straight lines (that is, a linear structure having two corners).

As shown in FIG. 4, FIG. 4 illustrates a schematic view of a method of forming a plurality of second grooves surrounding the second pattern by using self-aligned double pattering (SADP). The SADP method described herein is a technique known in the art and is characterized in that a groove can be formed surrounding the pattern. That is, since the second pattern 22 is formed on the second material layer 20, a plurality of second grooves 24 will be formed in the second material layer 20, and the second grooves 24 will surround the original position of the first sub-patterns 22A, the original position of the second sub-patterns 22B and the original position of the third sub-patterns 22C. Next, the first sub-patterns 22A, the second sub-patterns 22B and the third sub-patterns 22C are subsequently removed. The SADP process steps will be briefly mentioned in the following paragraphs, and the rest details of the SADP process will not be repeated here.

As shown in FIG. 5, one or more etching steps are performed to transfer the pattern of the overlapping region of the first grooves 14 and the second grooves 24 to a lower target layer 30, the target layer 30 is located under the first material layer 10. It should be noted that after the above etching step is performed, the remaining pattern is an overlapping pattern of the first grooves 14 and the second grooves 24. As shown in FIG. 5, the remaining pattern includes a plurality of circular holes arranged in an array, and elliptical holes arranged in a frame shape and surrounding the circular holes. Each circular hole is defined as a third pattern 32, and each elliptical hole is defined as a fourth pattern 34. In other embodiments, the third patterns and the fourth patterns may not be circular hole or elliptical hole, but include other shapes such as a rectangle, and the present invention is not limited thereto.

In addition, a cell region R1 is further defined, the third patterns 32 and the fourth patterns 34 are disposed within the cell region R1, and the region other than the cell region R1 is defined as the peripheral region R2, in other words, the third patterns 32 and the fourths pattern 34 are not located within the peripheral region R2. Each fourth pattern 34 is adjacent to the boundary of the cell region R1 and the peripheral region R2. The cell region R1 described herein is preferably a region in which a storage node contact is formed in the subsequent steps, and the storage node contact structures are not formed in the peripheral region R2.

The Applicant has found that during the fabrication process, since the component densities in the cell region R1 and the peripheral region R2 are different, some components near the boundary of the cell region R1 are liable to defect. For example, when etching a contact hole near the boundary, the holes are not easily completely etched, and thus a part of the insulating layer remains in the hole, causing the subsequently formed contact structure cannot be conductive. The above phenomenon is also called a micro-loading effect. In order to solve the above problem, in the present invention, the size of the hole close to the boundary region is intentionally enlarged, that is, the area of the fourth pattern 34 is made larger than the area of the third pattern 32. As a result, when the contact hole is subsequently etched, since the fourth pattern 34 has a large area, more etching liquid can be accommodated, and it is easier to be completely etched, thereby avoiding the problem of the above-mentioned contact hole being blocked.

In order to achieve the above object, the present invention proposes a first pattern 12 and a second pattern 22 of special shapes, when viewed in a top view, the elongated structures 12-1 of the first pattern 12 and the elongated structures 22-1 of the second pattern 24 cross each other in the cell region R1, and the third patterns 32 will be formed as the circular holes (or other shaped structures) in an array arrangement. On the other hand, since the first pattern 12 and the second pattern 22 being close to the boundary portion are mainly composed of horizontal components (12H, 22H) or vertical components (12V, 22V), so the overlapping area is larger, and the subsequent fourth patterns 34 have larger areas than the area of each third pattern 32. In addition, the present invention can also change the overlapping area of the first pattern 12 and the second pattern 22 in the boundary region by adjusting the length, width or overlapping position of the horizontal component (12H, 22H) or the vertical component (12V, 22V). Therefore, the area of the fourth patterns 34 can be adjusted according to actual needs.

Referring to FIG. 6 to FIG. 13, which show the schematic diagrams of forming the first pattern, the second pattern, the third pattern and the fourth pattern in a SADP process, and the descriptions of FIG. 1 to FIG. 5 can be referred to together.

Figure 6:
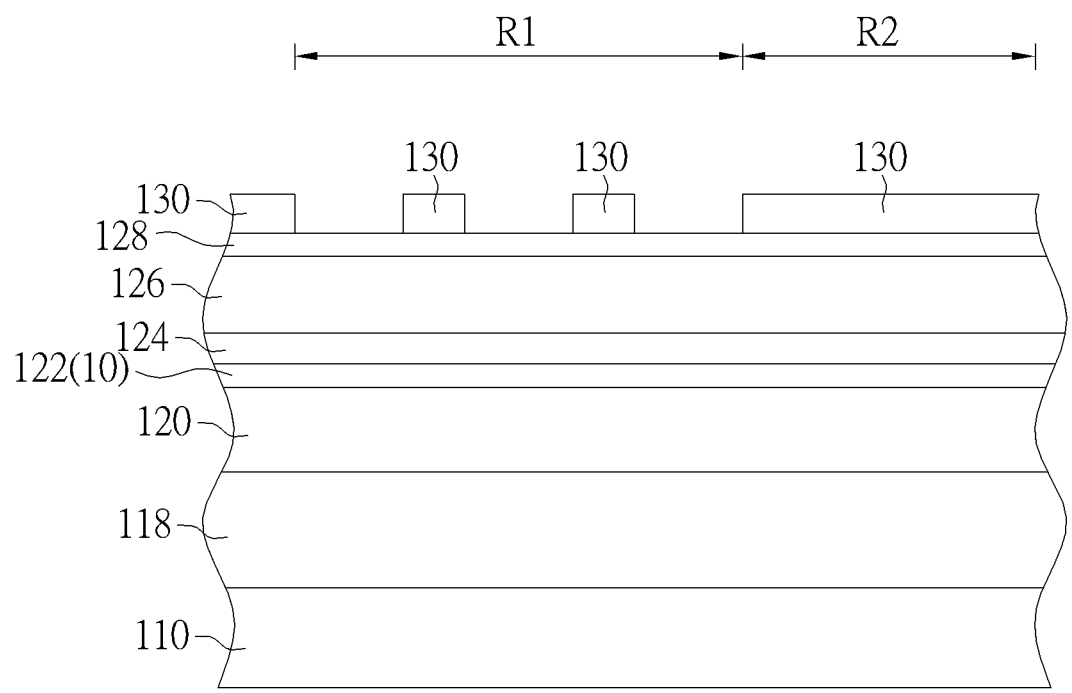
FIG. 6 to FIG. 13 show the schematic diagrams of forming the first pattern, the second pattern, the third pattern and the fourth pattern in a SADP process.

As shown in FIG. 6, a substrate 110 is provided. A cell region R1 and a peripheral region R2 (same as the cell region R1 and a peripheral region R2 shown in FIG. 5) are defined on the substrate 110. In the following steps, some components such as the buried word lines of the present invention that will be formed are mainly located in the cell region R1.

The substrate 110 includes a multi-layers structure. The multi-layers structure may include an oxide layer 118, an amorphous carbon (APF) layer 120, and a nitride layer 122, but not limited thereto. In this embodiment, the oxide layer 118 covers the substrate 110 directly to protect the substrate 110, and the oxide layer 118 can be subsequently removed by an ashing process, so that the oxide layer 118 has less influence to the device. In addition, in the present invention, the oxide layer 118 has a thickness of about 400-600 angstroms, the amorphous carbon layer 120 has a thickness of about 1500-2500 angstroms, and the nitride layer 122 has a thickness of about 150-250 angstroms, but not limited thereto. It should be noted that the nitride layer 122 herein is the first material layer 10 described in FIG. 1 above.

An oxide layer 124 is additionally formed on the multi-layers structure (e.g., the oxide layer 118, the amorphous carbon layer 120 and the nitride layer 122), the oxide layer 124 has a thickness of about 300-500 angstroms, such as 400 angstroms. Next, a photoresist layer is formed on the oxide layer 124. The photoresist layer may comprise a single layer or a multi-layers structure. Taking this embodiment as an example, the photoresist layer is a multi-layers structure, including a plurality of photoresist layers, such as an organic dielectric layer (ODL) 126, a silicon-containing hard-mask bottom anti-reflection coating (SHB) 128, and a patterned photoresist layer 130. The thickness of the organic dielectric layer 126 is about 1500-2500 angstroms, but is not limited thereto. It should be noted that the pattern of the patterned photoresist layer 130 is the same as the first pattern 12 described above in FIG. 1.

Figure 7:
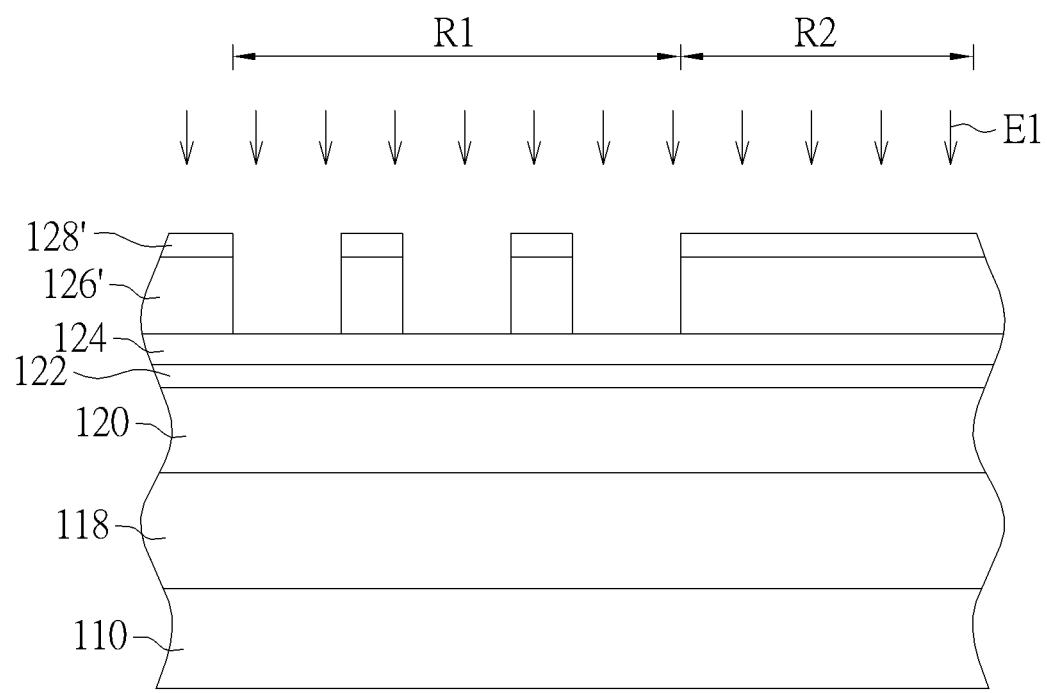
Figure 8:
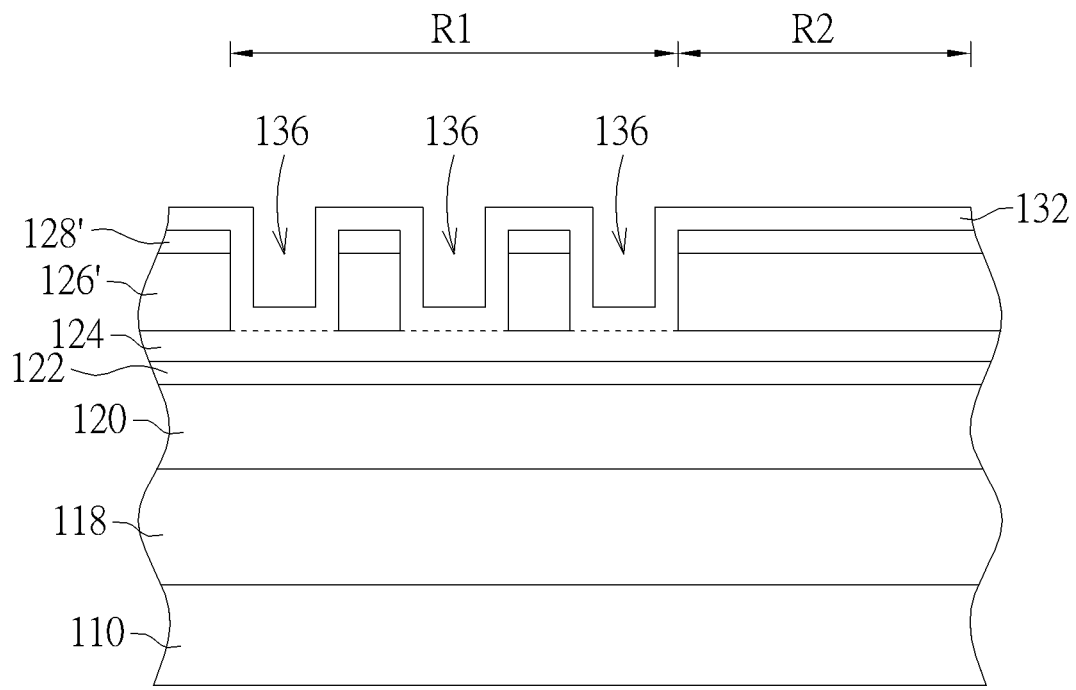

Next, as shown in FIG. 7, an etching step E1 is performed. Using the patterned photoresist layer 130 as a mask, to remove portions of the organic dielectric layer 126 and portion of the SHB 128, and to form a patterned organic dielectric layer 126' and a patterned SHB 128'. Besides, the exposed part of the oxide layer 124, and the patterned photoresist layer 130 is also removed. Then, as shown in FIG. 8, an oxide layer 132 is formed to cover the patterned organic dielectric layer 126', the patterned SHB 128' and the oxide layer 124. In other words, the bottom and two sidewalls of the patterned organic dielectric layer 126' will contact the oxide layer 124 and the oxide layer 132 respectively. Since the oxide layer 132 has a "battlements profile" as seen from the cross-sectional view, the recessed portion of the oxide layer 132 is defined as a plurality of first grooves 136. In this embodiment, the oxide layer 132 has a thickness of about 200-300 angstroms, for example, 240 angstroms. In addition, the oxide layer 124 and the oxide layer 132 preferably have the same material or the same etching rate, and therefore they can be removed simultaneously in the subsequent etching step.

Figure 9:
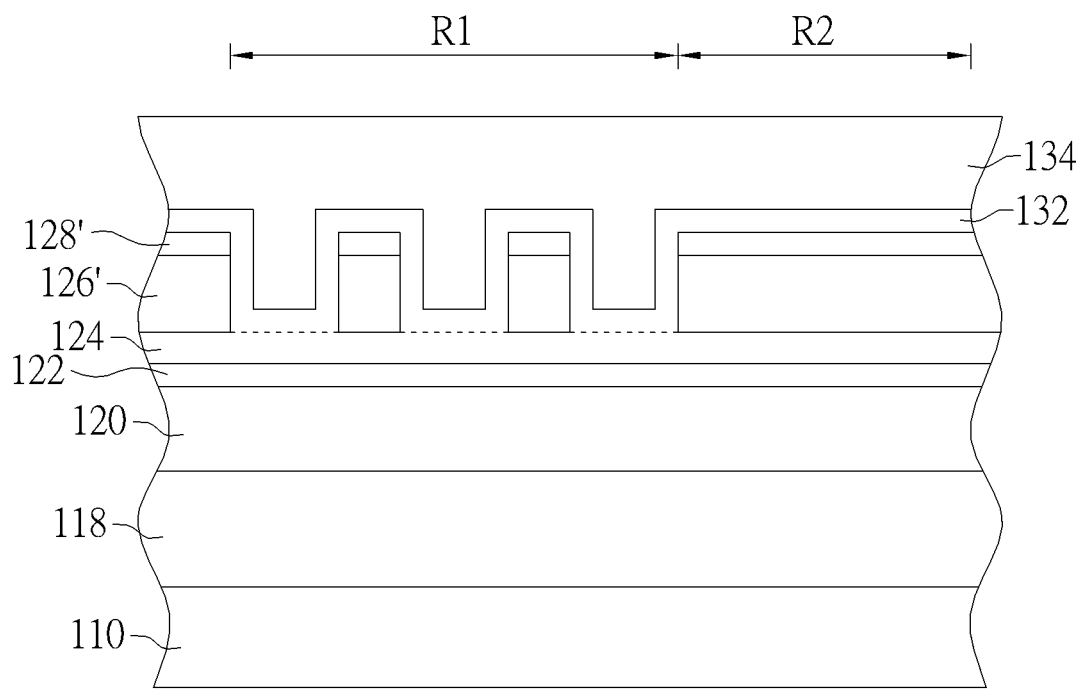
Figure 10:
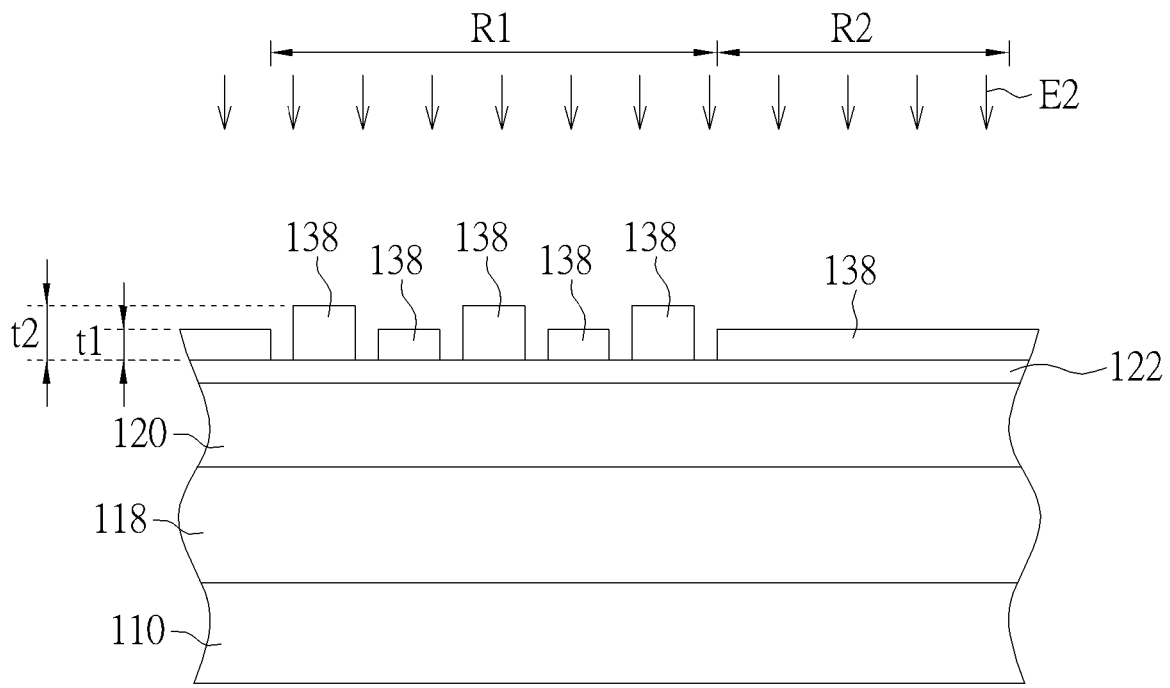

As shown in FIG. 9, an organic dielectric layer 134 is formed again and filled in each of the first grooves 136. The organic dielectric layer 134 is preferably made of the same material as the organic dielectric layer 126. Then, as shown in FIG. 10, one or more etching steps are performed, for example, a second etching step E2 is performed, using the patterned organic dielectric layer 126' and the organic dielectric layer 134 as a mask, and the nitride layer 122 is used as a stop layer, to remove a portion of the oxide layer 132 and oxide layer 124, and the rest patterned organic dielectric layer 126'and the organic dielectric layer 134 are then removed by another etching step. It should be noted that at this step, the residual oxide layer 24 and the oxide layer 32 are redefined as a plurality of oxide masks 138, and the remaining oxide mask 138 includes at least two different thicknesses t1 and thicknesses t2, where t2 is greater than t1.

Figure 11:
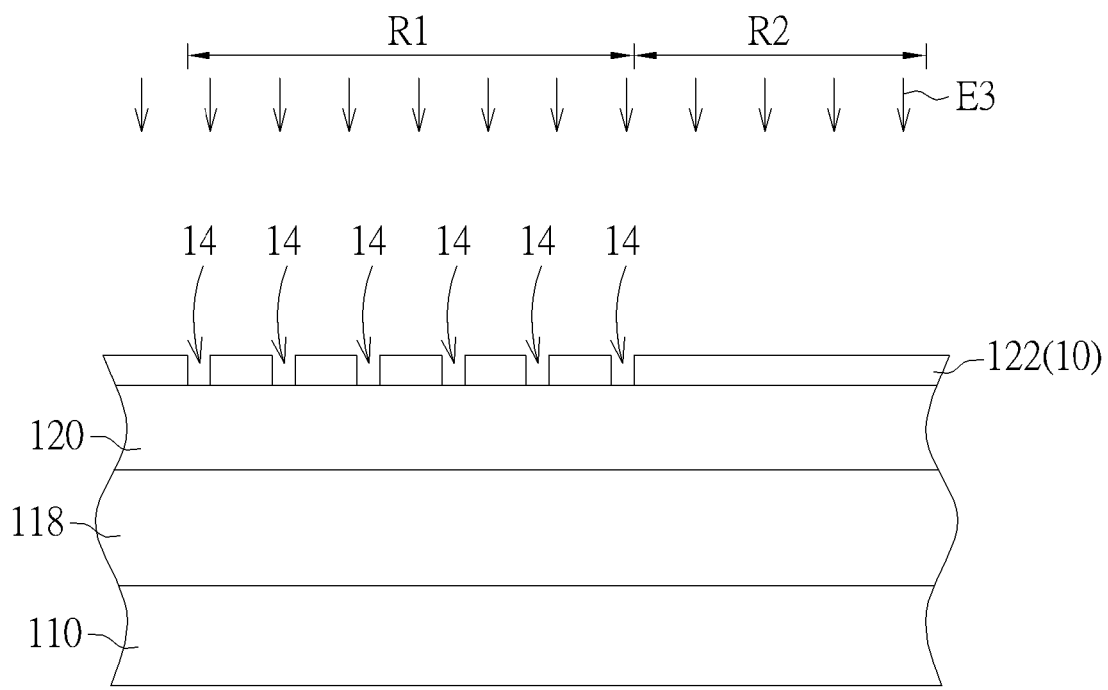

As shown in FIG. 11, a third etching step E3 is performed to transfer the pattern of the oxide mask 138 into the nitride layer 122 to form a plurality of first grooves 14. It is noted that each first groove 14 described herein is same as the first groove 14 described in FIG. 2.

Figure 12:
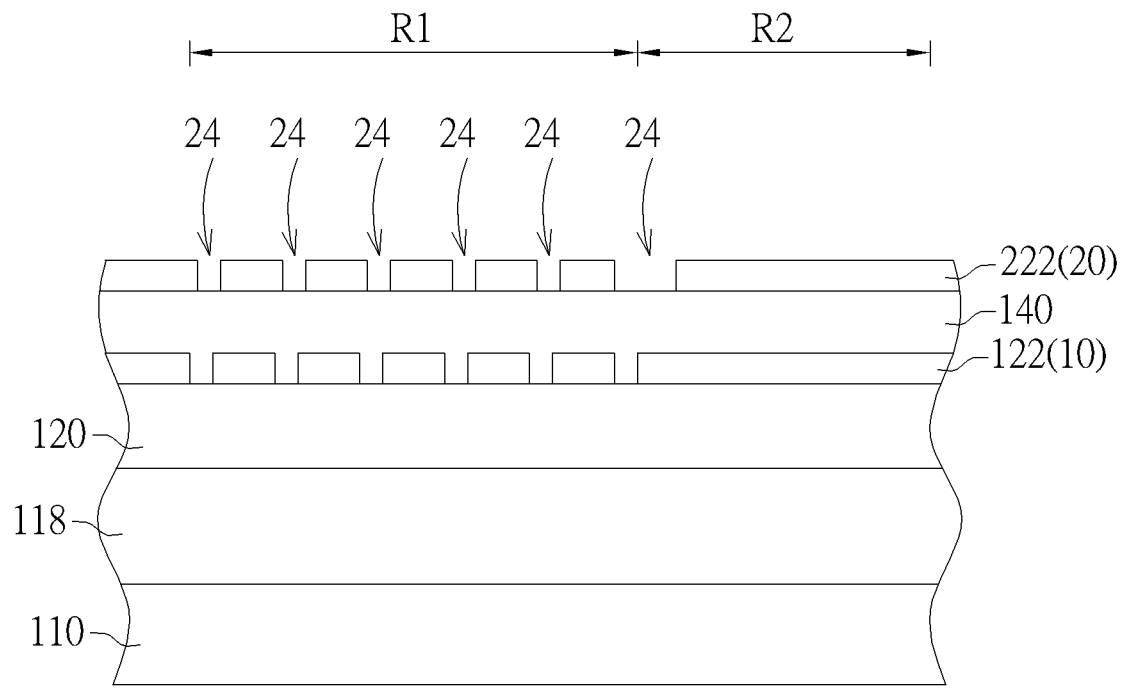

As shown in FIG. 12, a flat dielectric layer 140 is formed on the nitride layer 122, and then the steps of FIG. 6 to FIG. 11 are repeated to form a second nitride layer 222 on the dielectric layer 140. The second nitride layer 222 includes a plurality of second grooves 24 therein. It should be noted that the second nitride layer 222 here is same as the second material layer 20 described in FIG. 3 above.

Figure 13:
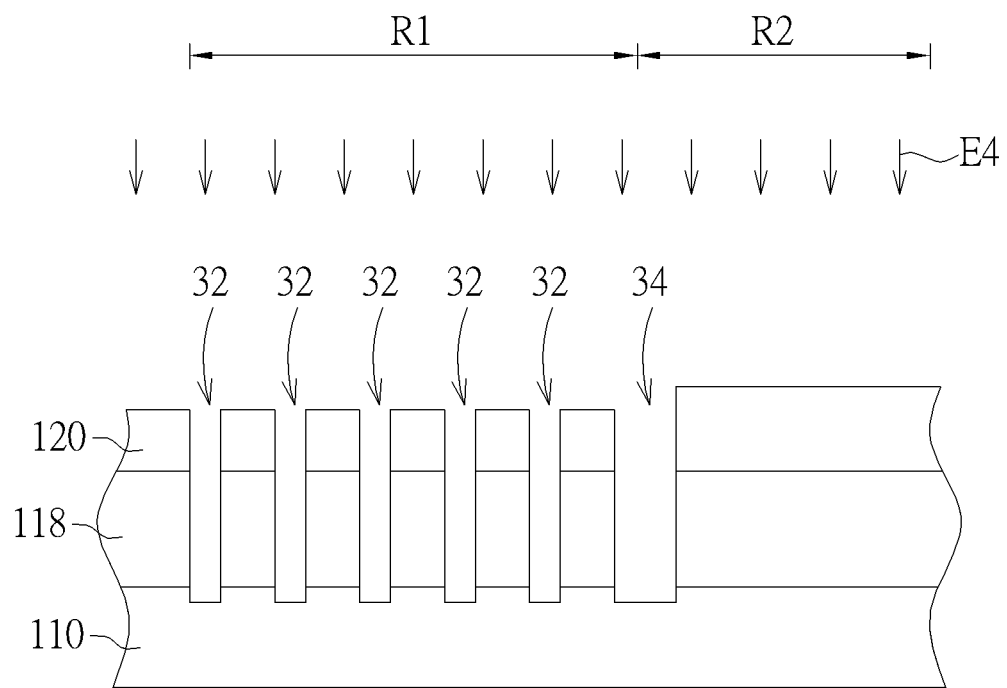

Finally, as shown in FIG. 13, a fourth etching step E4 is performed to transfer the pattern of the overlapping portion of the first grooves 14 and the second grooves 24 to the lower target layer (i.e., the substrate 110, the oxide layer 118, and the APF 120), and a plurality of grooves, that is, the third patterns 32 and the fourth patterns 34 are formed in the target layer. In the subsequent steps, the third patterns and the fourth patterns are further formed into other semiconductor components, such as a storage node contact structure, etc., and the process steps are known in the art, and will not be further described herein.

In summary, the present invention is characterized in that a first pattern and a second pattern of special shapes are designed, and a storage node contact hole is formed by means of SADP (self-aligned double patterning). Therefore, a plurality of holes arranged in an array are formed in the cell region, and the holes having a larger area are formed on the outer periphery. As a result, defects caused by micro-loading effects in the semiconductor process can be reduced. In addition, the present invention can also control the size of the holes formed by adjusting the overlapping position of the first pattern and the second pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor pattern, comprising:
   providing a target layer, and a first material layer is formed on the target layer;
   forming a first pattern on the first material layer;
   performing a first self-aligned double pattering step, to define a plurality of first sidewall patterns around the first pattern, and to transfer the first sidewall patterns into the first material layer to form a plurality of first grooves in the first material layer;
   forming a second material on the first material layer;
   performing a second self-aligned pattern transfer step, to define a plurality of second sidewall patterns around the second pattern, and to transfer the second sidewall patterns into the second material layer to form a plurality of second grooves in the second material layer; and
   performing an etching step to transfer an overlapping portion of the first grooves and the second grooves into the target layer, wherein the target layer includes a plurality of third patterns and a plurality of fourth patterns from a top view, and wherein an area of each of the fourth patterns is larger than an area of each of the third patterns.

2. The method of claim 1, wherein each of the third patterns is arranged in an array.

3. The method of claim 2, wherein the fourth patterns are arranged in a frame shape surrounding the third patterns arranged in an array.

4. The method of claim 1, wherein when viewed in a top view, each third patterns comprises a circular hole, and each fourth pattern comprises an elliptical hole.

5. The method of claim 1, wherein the first pattern is composed of a plurality of first sub-patterns A, a plurality of second sub-patterns B, and a plurality of third sub-patterns C, each of the first sub-patterns A, each of the second sub-patterns B, and each of the third sub-patterns C comprise an elongated strip pattern arranged along a first direction.

6. The method of claim 5, wherein each of the first sub-patterns A further includes a horizontal component and a vertical component respectively located on two sides of the elongated strip pattern, and wherein the horizontal component is arranged along a horizontal direction, and the vertical component is arranged along a vertical direction.

7. The method of claim 6, wherein each of the second sub-patterns B further comprise two horizontal components arranged along the horizontal direction and respectively located on two opposite sides of the elongated strip pattern.

8. The method of claim 7, wherein the second pattern is composed of a plurality of first sub-patterns D, a plurality of second sub-patterns E, and a plurality of third sub-patterns F, each of the first sub-patterns D, each of the second sub-patterns E, and each of the third sub-patterns F comprise an elongated strip pattern arranged along a second direction.

9. The method of claim 8, wherein each of the first sub-patterns D further includes a horizontal component and a vertical component respectively located on two sides of the elongated strip pattern, and wherein the horizontal component is arranged along a horizontal direction, and the vertical component is arranged along a vertical direction.

10. The method of claim 9, wherein each of the second sub-patterns E further comprise two horizontal components arranged along the horizontal direction and respectively located on two opposite sides of the elongated strip pattern.

11. The method of claim 10, wherein the first direction and the second direction are not parallel to each other, and the first direction is not parallel to the horizontal direction or the vertical direction.

12. The method of claim 5, wherein the first sidewall pattern surrounds each of the first sub-patterns A, each of the second sub-patterns B, and each of the third sub-patterns C.

13. The method of claim 1, wherein the first self-aligned pattern transfer step comprising:
   forming the first pattern having a plurality of grooves;
   forming an oxide layer covering each of the first patterns and filling each of the grooves;
   forming a material layer covering the oxide layer and filling each of the grooves; and
   performing an etching step, using the first pattern and the material layer as a mask, to remove a portion of the oxide layer.

14. The method of claim 13, further comprising forming a second oxide layer between the first material layer and the first pattern, wherein during the first self-aligned pattern transfer step, the oxide layer fills the groove and disposed on the second oxide layer.

15. The method of claim 14, wherein after the etching step is performed, the remaining oxide layer is located on the second oxide layer and is defined as an oxidized mask, and the oxidized mask comprises at least two different thicknesses.

16. The method of claim 1, wherein a cell region and a peripheral region are defined on the target layer, and each fourth pattern is adjacent to the peripheral region.

* * * * *